(12) United States Patent
Sud

(10) Patent No.: US 12,400,134 B2
(45) Date of Patent: Aug. 26, 2025

(54) WAVEFORM ANALYSIS AND VULNERABILITY ASSESSMENT (WAVE) TOOL

(71) Applicant: The Aerospace Corporation, El Segundo, CA (US)

(72) Inventor: Seema Sud, Reston, VA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 927 days.

(21) Appl. No.: 17/244,197

(22) Filed: Apr. 29, 2021

(65) Prior Publication Data

US 2022/0358374 A1    Nov. 10, 2022

(51) Int. Cl.
*G06N 5/04* (2023.01)
*G06F 17/14* (2006.01)
*G06N 20/00* (2019.01)

(52) U.S. Cl.
CPC ............. *G06N 5/04* (2013.01); *G06F 17/142* (2013.01); *G06N 20/00* (2019.01)

(58) Field of Classification Search
CPC ........ G06N 5/00; G06N 20/00; G06F 17/142; G06F 30/27; G06F 30/367; H04K 3/25; H04K 3/827; H04K 3/94; H04B 17/30
See application file for complete search history.

(56) References Cited

U.S. PATENT DOCUMENTS

| | | | | |
|---|---|---|---|---|
| 8,229,344 B1* | 7/2012 | Petersen | ................. | H04K 3/94 |
| | | | | 455/67.11 |
| 2017/0111069 A1* | 4/2017 | Dafesh | ................. | H04B 1/1027 |
| 2018/0091336 A1* | 3/2018 | Mody | ................. | H04L 27/0006 |
| 2020/0311576 A1* | 10/2020 | Yamaguchi | ............ | G06N 20/10 |
| 2021/0334705 A1* | 10/2021 | Akbar | ................... | G06N 20/20 |
| 2022/0295495 A1* | 9/2022 | Rahmes | .................... | G06N 3/08 |

OTHER PUBLICATIONS

Andrew Tch, "The mostly complete chart of Neural Networks, explained," available at https://towardsdatascience.com/the-mostly-complete-chart-of-neural-networks-explained-3fb6f2367464 (Aug. 4, 2017).

(Continued)

*Primary Examiner* — Hope C Sheffield
(74) *Attorney, Agent, or Firm* — LeonardPatel PC

(57) ABSTRACT

A waveform analysis and vulnerability assessment (WAVE) tool is disclosed that can analyze the characteristics and vulnerabilities of waveforms. The WAVE tool may identify issues in waveforms prior to their implementation in a transmit device or building the back-end processing to receive the waveform at a ground station. The WAVE tool may quantify waveform vulnerabilities, address which vulnerabilities a particular waveform has, and enable the user to modify the waveform design to optimize its performance against threats prior to implementation. Additionally, the WAVE tool may save time and money since new waveforms can be vetted against the tool before implementation. Data from waveforms can be analyzed against a plurality of metrics and scores can be generated providing a quantitative assessment of waveform performance.

31 Claims, 4 Drawing Sheets

(56) References Cited

OTHER PUBLICATIONS

Dave, M.B., "Spectrum Sensing in Cognitive Radio: Use of Cyclostationary Detector," Master's Thesis, National Institute of Technology, India (2012).
Gardner, W.A., "Cyclostationarity in Communications and Signal Processing," IEEE Press, Piscataway, NJ (1994).
Verma, P.K., et al., "Performance Analysis of Energy Detection, Matched Filter Detection, & Cyclostationary Feature Detection Spectrum Sensing Techniques," Int. J. of Comp. Eng. Research, vol. 2, No. 5 (Sep. 2012).

* cited by examiner

WAVEFORM ANALYSIS AND VULNERABILITY ASSESSMENT (WAVE) TOOL

FIELD

The present invention generally relates to waveform assessment, and more specifically, to a waveform analysis and vulnerability assessment (WAVE) tool that can analyze the characteristics and vulnerabilities of waveforms.

BACKGROUND

Commercial and government entities and their mission partners have a need to assess their waveform vulnerabilities in an ever-increasing threat environment. Among these organizations, there is no existing way to quantify the threats or to compare and evaluate new or existing waveforms and assess their vulnerabilities against these threats. Indeed, the problem of waveform assessment has not been addressed in any depth. Current "tools" simply qualify waveform threats in very high-level terms, such as using the standard red/yellow/green stoplight characterization to qualify threats. Nothing is quantified, and specific vulnerabilities are not identified.

Waveforms are being simulated and built so the waveform data is available, but there is no way to analyze or evaluate their performance, compare existing waveforms, evaluate new waveforms, or determine ways in which waveforms are vulnerable. Also, there is no tool available that will allow custom waveforms that include specialized blocks to be modeled. It is important to model various waveform functions since some may exhibit features or perform worse against threat receivers than others. There are also no waveform metrics that have been developed.

Currently, commercial and government entities typically receive new waveform proposals from contractors, which are usually costly, take significant time to implement, and perhaps most importantly, can be risky to the user if they do not perform well and maintain a low probability of detection/interception (LPD/I). Sometimes, a contractor will claim that a waveform is LPD/I, but the commercial or government customer does not have an effective mechanism for determining whether this assertion is true. Thus, commercial and government entities often implement new waveforms unaware of their risk, and at a huge cost impact. Furthermore, waveforms are costly and may take 1-2 years from inception to initial operations, with a price tag usually upwards of $1 million. Accordingly, an improved approach and mechanism for waveform assessment may be beneficial.

SUMMARY

Certain embodiments of the present invention may provide solutions to the problems and needs in the art that have not yet been fully identified, appreciated, or solved by current waveform assessment technologies. For example, some embodiments of the present invention pertain to a WAVE tool that can analyze the characteristics and vulnerabilities of waveforms.

In an embodiment, an apparatus includes memory storing computer program instructions for performing waveform analysis and at least one processor configured to execute the computer program instructions. The computer program instructions are configured to cause the at least one processor to analyze data from a first waveform against a plurality of metrics. The analysis of the data from the first waveform includes providing inputs for the plurality of metrics from user-selected parameters, default parameters, or a combination thereof. The computer program instructions are also configured to cause the at least one processor to generate one or more scores pertaining to performance of the first waveform against the plurality of metrics.

In another embodiment, a computer-readable medium stores a computer program. The computer program is configured to cause at least one processor to analyze data from a first waveform and data from a second waveform against a plurality of metrics. The analysis of the data from the first waveform and the data from the second waveform includes providing inputs for the plurality of metrics from user-selected parameters, default parameters, or a combination thereof. The computer program is also configured to cause the at least one processor to generate one or more scores pertaining to performance of the first waveform against the plurality of metrics and generate one or more scores pertaining to performance of the second waveform against the plurality of metrics. The computer program is further configured to cause the at least one processor to provide a comparison between the first waveform and the second waveform using the one or more scores generated for the first waveform and the one or more scores generated for the second waveform, provide an indication of which waveform between the first waveform and the second waveform performed better using the one or more scores generated for the first waveform and the one or more scores generated for the second waveform, or both.

In yet another embodiment, a computer-implemented method includes training a machine learning (ML) model to automate optimization of waveforms using a given operating environment, atmospheric channel characteristics, or both, based on a reward function for optimizing one or more metrics. The computer-implemented method also includes analyzing data from a first waveform against a plurality of metrics. The analysis of the data from the first waveform includes providing inputs for the plurality of metrics from user-selected parameters, default parameters, or a combination thereof. The computer-implemented method further includes generating one or more scores pertaining to performance of the first waveform against the plurality of metrics and executing the trained ML model using the data from the first waveform to automatically modify the first waveform and improve performance of the first waveform for at least one of the plurality of metrics.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

Unless otherwise indicated, similar reference characters denote corresponding features consistently throughout the attached drawings.

DETAILED DESCRIPTION OF THE EMBODIMENTS

Figure 1:
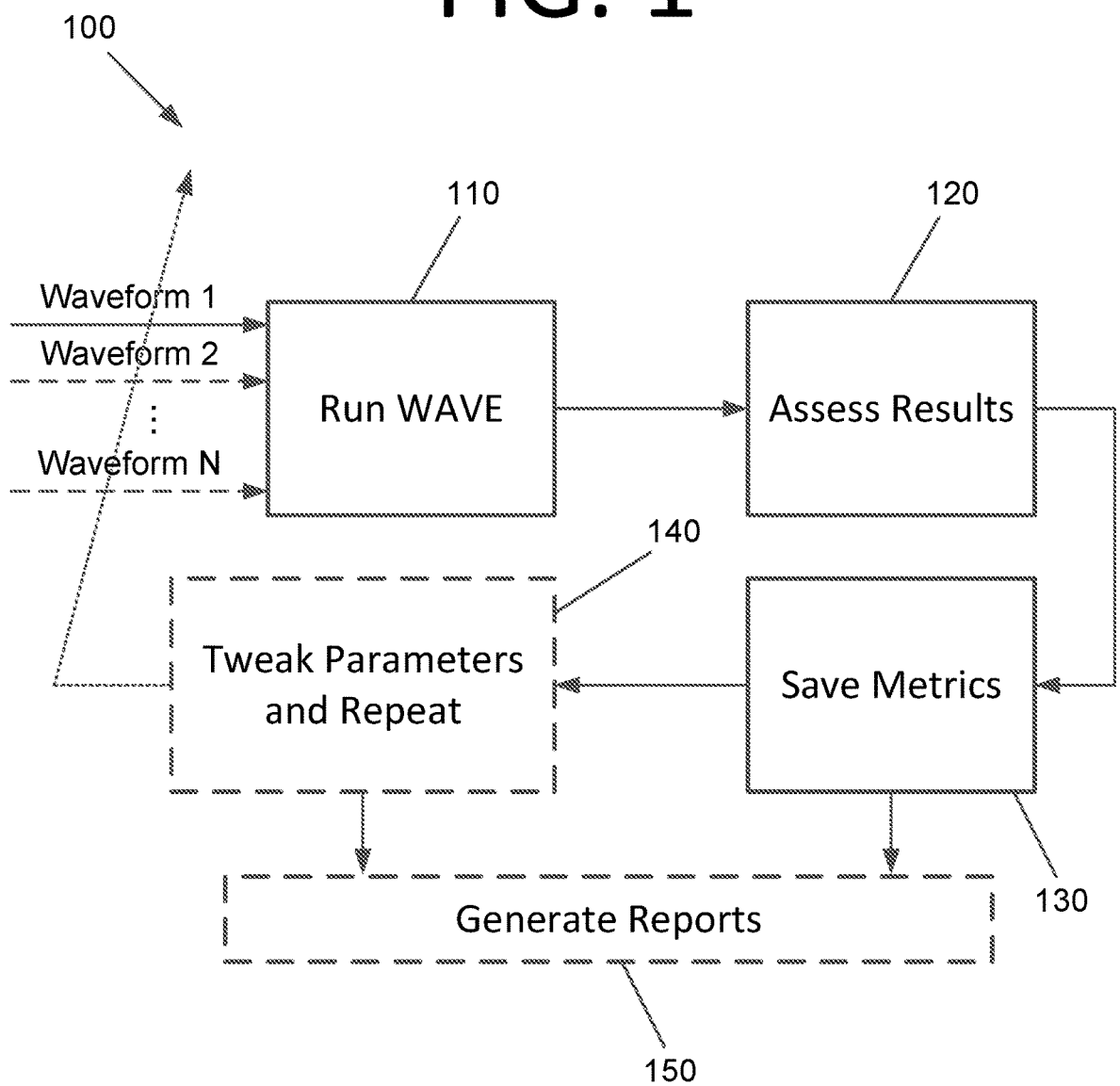
FIG. 1 is a block diagram illustrating a process for performing waveform analysis and vulnerability assessment, according to an embodiment of the present invention.

Some embodiments pertain to a WAVE tool that can analyze the characteristics and vulnerabilities of waveforms. Many commercial and government entities are interested in building waveforms that have a low probability of detection (i.e., a high probability of not being not seen) and a low probability of intercept (i.e., a high probability that the waveform will not be collected and information extracted therefrom, such as information about the system). Currently, there is no way to determine whether a waveform meets these criteria, and commercial and government entities have expressed that currently available waveform assessment approaches present a huge knowledge gap and an important unaddressed problem. Metrics would be useful to quantitatively determine whether one waveform is better than another, and such a capability does not currently exist.

The WAVE tool of some embodiments addresses the shortcomings noted above by identifying issues in waveforms prior to their implementation in a transmit device or building the back-end processing to receive the waveform at a ground station. The WAVE tool may quantify waveform vulnerabilities, address which vulnerabilities a particular waveform has, and enable the user to modify the waveform design to optimize its performance against threats prior to implementation. Additionally, the WAVE tool of some embodiments saves time and money since new waveforms can be vetted against the tool before implementation.

New waveform development is costly and time consuming using conventional development approaches, and the cost and schedule should be improved to keep up with the ever-changing environment. Thus, it is of great benefit to have a tool to assess new waveforms before they are implemented. A prototype embodiment of the WAVE tool has been developed in MatLab® with a graphical user interface (GUI) to enhance ease of use. The prototype tool allows users to choose from a set of pre-canned waveforms that are directly built into the tool or to build their own custom waveform by choosing from a list of available waveform parameters, such as scrambling, spreading, and modulation. A feature of the prototype tool is that it is the only existing tool that quantifies waveform performance by evaluating waveforms against a set of approximately 18 metrics, thereby providing comprehensive and robust performance assessment. Also, two or more waveforms may be compared in some embodiments to assess their similarity using quantified metrics (i.e., a similarity comparison). For example, the scores for the waveforms may be presented proximate to one another and waveforms having metric scores that are relatively close to one another (e.g., within a certain percentage, a certain integer or floating point value, etc.) may be flagged. This may substantially reduce the potential threat to users before they perform operations in the field, as well as save cost in building new waveforms that are relatively similar to existing ones.

The WAVE tool of some embodiments provides waveform vulnerability analysis capabilities that quantify the risks and allow for waveform design changes to be made and evaluated. The WAVE tool may also enable users to compare waveforms. For example, a user can determine whether a new waveform is too similar to an old waveform that has been declared unusable.

The WAVE tool of some embodiments is a modular tool with the flexibility to build custom waveforms, as well as be pre-populated with known waveforms of interest. Waveforms may be run individually or in groups (e.g., pairs, three waveforms, four waveforms, more, etc.) and be evaluated/compared against threat metrics, which is a unique and novel feature. These include parameters such as bit rate ($R_b$) vs. free space detection range ($R_d$), signal-to-noise ratio (SNR) vs. probability of detection ($P_D$) by a threat receiver, etc. An extensive list of metrics has been developed and is described herein. However, it should be noted that variations to these metrics and/or other metrics may be employed without deviating from the scope of the invention. Each metric may utilize an input set of parameters (e.g., based on the waveform characteristics) and produce an output value or plot, such as an autocorrelation of the waveform to identify significant features.

Autocorrelation involves producing two copies of a waveform (i.e., copy 1 and copy 2), multiplying each sample in copy 1 by the corresponding sample in copy 2, and adding them to produce a single output at time 0. Then, one of the copies (e.g., copy 2) is shifted by one sample and the process is repeated, producing the output at time 1. Copy 2 is then shifted by two samples and the process is repeated to obtain the output at time 2. This is repeated until copy 2 has been shifted by all of the samples.

Autocorrelation is performed to show features, structure, and patterns in waveforms. Autocorrelation can also be used to detect a waveform. For instance, copy 1 may be a received signal and copy 2 may be a locally generated version of the waveform of interest. Copy 1 and copy 2 are autocorrelated to check whether the received signal contains the waveform of interest.

Analysis of the metrics may allow assessment of the waveform vulnerabilities. This can be accomplished in some embodiments by inspecting the metric outputs. The waveform may then be modified and run against the metrics as often as desired until a satisfactory, improved, or optimal design is achieved. When two or more different waveforms are compared, the WAVE tool of some embodiments generates a score for each waveform to enable a user to quickly determine which waveform performed better. Individual scores for each metric may additionally or alternatively be generated for both waveforms so that users can compare the scores of specific metrics that may be of more interest than other metrics to determine which waveform performs better. Tweaks of one or both waveforms could then be made and run through the tool again until a satisfactory design is achieved. The results can be saved and used later.

FIG. 1 is a block diagram 100 illustrating a process for performing waveform analysis and vulnerability assessment, according to an embodiment of the present invention. The process begins with inputting a waveform or multiple waveforms if comparison is desired (e.g., 2 waveforms, 3 waveforms, N waveforms, etc.) and running the WAVE tool at 110. Results produced by the WAVE tool can then be assessed at 120, and the metrics can be saved at 130. The metrics are discussed in more detail below, and may include comparisons and/or differences between the metrics of the input waveforms in some embodiments. Waveform parameters may be tweaked at 140 and the wave tool may be run again at 110 using these modified parameters. Reports may also be generated at 150. Reports may include results from running the metrics, a summary of the results in text form, etc.

A table of the variables and acronyms used herein is provided below.

TABLE 1

VARIABLES AND ACRONYMS

| | |
|---|---|
| $A_{er}$ | Effective area of the receiver antenna = $nA_r$ |
| APSK | Amplitude phase shift keying |
| ARP | Almost regular permutation |
| $A_r$ | Physical area of the receiver antenna |
| BCH | Bose-Chaudhuri-Hocquenghem |
| BEM | Bandwidth efficient modulation |
| $B_N$ | Noise bandwidth |
| BPSK | Binary phase shift keying |
| $B_{th}$ | Threat receiver bandwidth |
| c | The speed of light (i.e., ~$3^8$ meters (m) per second (s)) |
| CAF | Cross-ambiguity function |
| CFD | Cyclo-stationary feature detector |
| C/N | Carrier-to-noise ratio |
| DSSS | Direct sequence spread spectrum |
| DVB | Digital video broadcasting |
| ED | Energy detector |
| EIRP | Effective isotropic radiated power |
| $E_s$ | Energy per symbol |
| $f_c$ | Carrier (i.e., center) frequency (Hertz (Hz)) |
| FEC | Forward error correction |
| $f_s$ | Sampling frequency (samples/s) |
| FFT | Fast Fourier Transform |
| FHSS | Frequency hopped spread spectrum |
| FSK | Frequency shift keying |
| FSR | Dree space (detection) range (also denoted Rd) |
| k | Boltzmann's constant (i.e., ~$1.38 \times 10^{-23}$ Joules/Kelvin (K)) |
| K | Kelvin |
| $L_{path}$ | (free space) path loss |
| m | Number of bits per symbol (e.g., m = 1 for BPSK, m = 2 for QPSK) |
| n | Antenna efficiency |
| LPDC | Low density parity check |
| M | Number of samples to average for the ED or CFD |
| MSK | Minimum-phase shift keying |
| N | Noise power |
| $N_b$ | Number of bits (to generate) |
| $N_0$ | Noise power spectral density (PSD) (watts (W)/Hz) |
| OFDM | Orthogonal frequency division multiplexing |
| $P_D$ | Probability of detection |
| $P_{FA}$ | Probability of false alarm |
| PFD | Power flux density (W/m$^2$) |
| PN | Pseudo-random |
| $P_r$ | Received power |
| PSD | Power spectral density |
| PSK | Phase shift keying |
| QAM | Quadrature amplitude modulation |
| QPP | Quadratic polynomial permutation |
| QPSK | Quadrature phase shift keying |
| R | Range to the intended receiver of the signal (e.g., to a satellite, a cell tower, a cell phone, etc.) |
| $R_b$ | Bit rate |
| $R_d$ | Free space detection range |
| $R_s$ | Symbol rate (symbols/s) |
| RS | Reed-Solomon |
| SNR | Signal-to-noise ratio |
| ToA | Time-on-air |
| $T_{sys}$ | Receiver system noise temperature |
| THSS | Time hopped spread spectrum |
| * | Complex conjugate |

Figure 2:
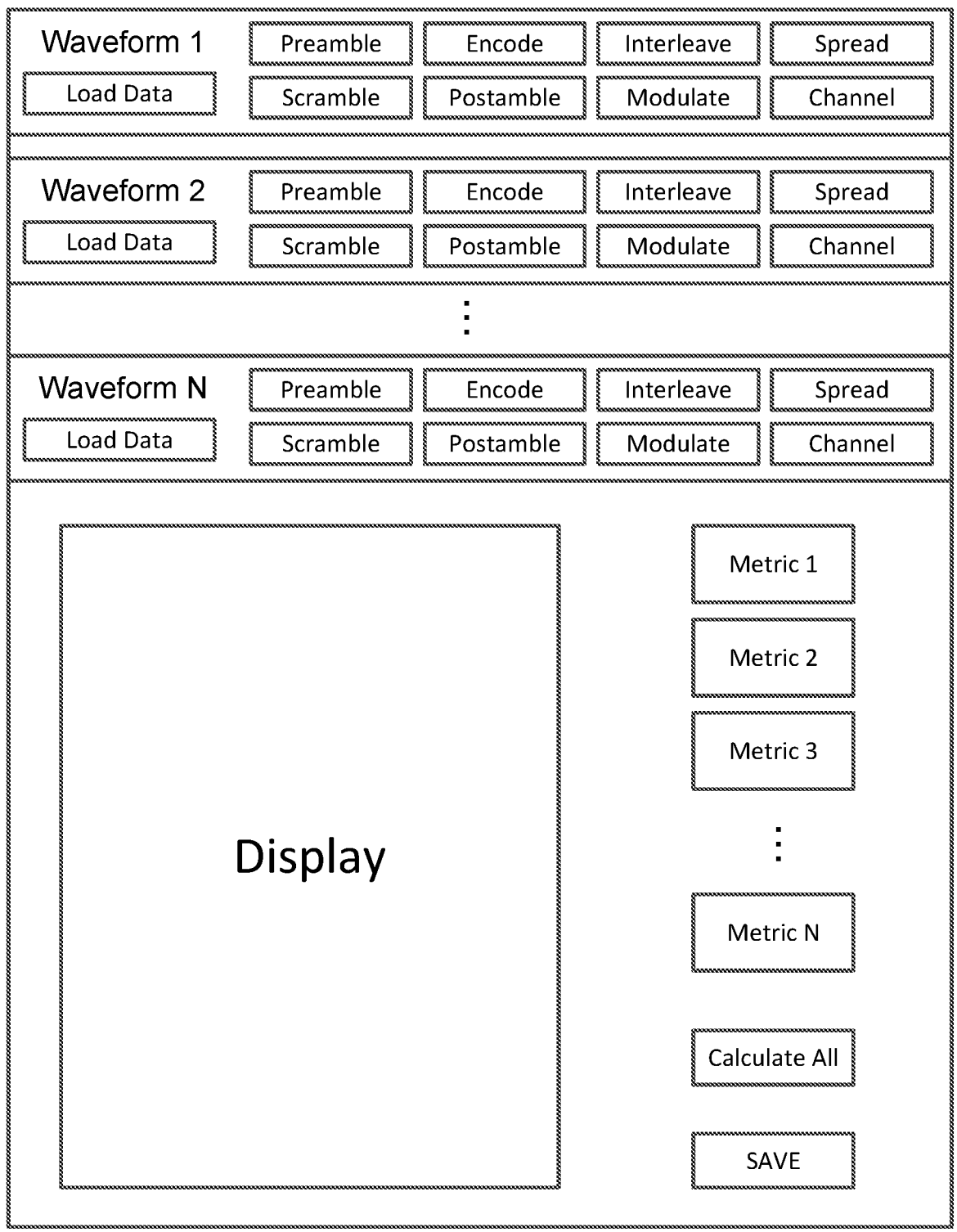
FIG. 2 is a block diagram illustrating a GUI of a WAVE tool, according to an embodiment of the present invention.

In some embodiments, the WAVE tool provides a GUI that allows users to run their waveforms and produce metrics to quantify their performance. FIG. 2 is a block diagram illustrating a GUI of a WAVE tool, according to an embodiment of the present invention. Users can choose "pre-canned" waveforms and/or modify custom waveform building block parameters, such as the type and rate of the FEC scheme. In some embodiments, the WAVE tool provides default values and informs users if parameters that they input or modify are invalid. Users can then choose which metric to compute individually by clicking the button for that metric or select a "Calculate All" button that calculates all metrics. Data may be loaded into the WAVE tool to run raw data files instead of the pre-canned or custom waveforms using the respective "Load Data" button. Outputs may be saved and reports may be generated when two or more waveforms are compared.

"Pre-Canned" Waveforms

The WAVE tool in some embodiments contains or has access to a library of pre-canned waveforms (e.g., including various commercial standards) that a user can select. These pre-canned commercial standard waveforms may include, but are not limited to, OFDM, DVB-S, DVB-S2, DVB-S2X, cdma2000, etc. Various other waveforms may also be included, such as QPSK, PN sequence spread QPSK, unmodulated PN sequences, individual chirps, multiple overlapping chirps, etc. The WAVE tool of some embodiments is designed in a modular fashion such that new waveforms can be integrated into the tool easily. Users may also be able to save, access, and modify custom-created waveforms.

Custom Waveform Building Blocks

If the user would prefer to build his or her own custom waveform, such waveforms may be created in some embodiments from a set of blocks, where a block can be disabled (i.e., bypassed) in some embodiments. The WAVE tool may generate some general waveform parameters, such as $f_s$, $f_c$, $R_b$, $N_b$, etc. The bits may be sequentially processed by each block to create the output modulated waveform. Below is an outline of the blocks in some embodiments.

Preamble: The WAVE tool may allow a user to choose to attach a preamble, such as a known pattern of bits loaded from a data file or a PN sequence, to be prepended to the data payload.

Encoder: This block represents the FEC that is applied to the data bits to resist errors induced by the atmospheric channel and receiver noise. In some embodiments, users can select from convolutional codes, a turbo code with options for the embedded interleaver, RS codes, BCH, LDPC codes, etc. Users can enter in the desired code rate, and a default may be set in some embodiments if otherwise unspecified (e.g., ½). New FECs may be added to the WAVE tool. The trellis for the codes, if needed, may be selected from a lookup table based on user-provided code rate. In addition, a user may provide a specific generator polynomial or trellis for his or her specific application. Users can also bypass this block, thereby not applying any FEC.

Interleaver: The user may select from row-column, helical, ARP, or QPP interleavers, for example. However, any desired types of interleavers may be used without deviating from the scope of the invention. For the row-column, users can specify the number of rows and columns to use. For helical, users can provide the number of rows and columns and the slope, which is defined by the number of bits the row index increases (as the column index increases by one). QPP allows for $f_1$ and $f_2$, the coefficients that define the permutation, to be specified. ARP has the following parameters in some embodiments: an integer parameter $P_0$, vectors $\alpha$ and $\beta$, and a constant offset A. The user can click on a button for further customization on parameters for each of these interleaver types in some embodiments. Defaults for each interleaver type may be provided, however, so the user may choose to just use these defaults. Users can again opt to bypass this function in some embodiments.

Spreading: The available spreading options in some embodiments are DSSS, FHSS, and THSS. The desired spreading factor (e.g., the number of chips per bit for DSSS) may be user-specified. A default value may be provided in some embodiments. The types of spreading codes for DHSS may include Gold, Kasami, Walsh, and chaotic, for example. Spreading may also be bypassed.

Scrambling: Scrambling sequences may be chosen from a set of Gold codes and chaotic codes in some embodiments. This block can also be bypassed if not desired by the user.

Postamble: Defined similarly as the preamble in some embodiments, this is an optional sequence of bits that is appended to the data.

Modulation: Digital modulation schemes are the primary schemes used in the WAVE tool in some embodiments. The user can choose from FSK, PSK, MSK, QAM, etc. The model may be general enough for the user to select the order of the modulation. QPSK may be provided as the default in some embodiments.

Channel: The user may choose to turn the channel off in some embodiments. In this case, in some embodiments, only white noise at the receiver is assumed to generate signals at the user specified C/N, which used in some of the metrics described herein. The user can select from an urban, suburban, indoor, or rural channel models, for example. The maximum frequency in which these models are valid may be flagged to the user if the chosen carrier frequency of the waveform exceeds this maximum limit. This ensures waveform compatibility with the channel model. International Telecommunication Union (ITU) models are used for all the channel models in some embodiments.

It should be noted that the WAVE tool has a modular design in some embodiments. Therefore, new options for one or more of the above waveform blocks, or additional waveform blocks, may be readily integrated into the architecture. For example, additional BEM schemes may be added, such as APSK.

Loading Data

In addition to or alternative to running pre-canned or custom waveforms as discussed above, in some embodiments, users may choose to load raw data files including waveform data. This may allow simulated data or real data (such as data collected from a device in a field experiment) to be tested. Data formats in some embodiments may include, but are not limited to, MatLab® .mat formats, Midas Blue files, .dat data files (standard text), etc.

Metrics

In some embodiments, general inputs that a user can provide include, but are not limited to, $f_s$, $P_{FA}$, SNR min/max, M, $R_b$, ToA, etc. Default values may be provided for inputs needed to compute a given metric. The following is a list of metrics that may be calculated by the WAVE tool in some embodiments. However, additional and/or alternative metrics may be used without deviating from the scope of the invention.

Metric 1: SNR vs. $P_D$ (Energy Detector)

Input: Desired $P_{FA}$, desired $P_D$, and M

Calculation: Compute using energy detector method, where a waveform is denoted as x(t). The energy of the waveform $E_{x(t)}$ is computed as:

$$E_{ED}=x(t)\cdot x^*(t) \qquad (1)$$

The energy may be averaged over M samples and compared to a threshold. The threshold may be based on the $P_{FA}$, M, and SNR. A detection occurs if the value of the energy in Eq. (1) exceeds the threshold. In some embodiments, a default number of trials T (e.g., T=1,000 trials) are performed and the number of detections is counted as the SNR is varied. $P_D$ is obtained by dividing the number of detections by the total number of trials T. The number of trials may be specified or changed by the user in some embodiments.

Output: SNR (associated with the specified $P_D$)

It should be noted that with the desired $P_D$ as an input, the output is a single SNR instead of a curve of SNR vs. $P_D$. It should also be noted that SNR=C/N≈$E_s/N_0$ in most cases, specifically for PSK modulation. The WAVE tool of some embodiments allows users to run this metric on the preamble and postamble individually, the data bits individually, or the waveform as a whole.

Metric 2: SNR vs. $P_D$ for a CFD

Input: Desired $P_{FA}$, desired $P_D$, and M

Calculation: Compute by taking an FFT of the waveform multiplied with a delayed version of itself, i.e., $$E_{CFD}=\text{FFT}\{x(t)\cdot x^*(t-1)\} \qquad (2)$$

Eq. (2) replaces Eq. (1), and the SNR associated with the specified $P_D$ is computed as in Metric 1.

Output: SNR (associated with the specified $P_D$)

It should be noted that with the desired $P_D$ as an input, the output is a single SNR instead of a curve of SNR vs. $P_D$. As with Metric 1, the WAVE tool of some embodiments allows users to run this metric on the preamble and postamble individually, the data bits individually, or the waveform as a whole.

Metric 3: EIRP vs. $R_d$

Input: EIRP, $f_c$, and $P_r$. Here, $P_r$ is the detectable power of an unintended (i.e., a threat) receiver, and the default of −150 dBW is used in some embodiments. In certain embodiments the user can change the default value.

Calculation: From the link budget equation, the received power C is:

$$C=P_r=\text{EIRP}-L_{path}+G_r \qquad (3)$$

where $G_r$ is the receive antenna gain and is assumed to be zero, $P_r$=−150 dBW (unless a different default or user-specified value is used), and EIRP is an input. $L_{path}$ is the path loss, defined as:

$$L_{path}=\left(\frac{4\pi R_d}{\lambda}\right)^2 \qquad (4)$$

where $$\lambda=\frac{c}{f_c} \qquad (5)$$

and c is the speed of light, $f_c$ is the specified carrier frequency, and λ is the wavelength of the carrier. Then, solve for $R_d$ using Eqs. (3)-(5).

Output: $R_d$

Metric 4: EIRP vs. $R_b$

Input: $P_{FA}$, $P_D$, M, EIRP, $R_d$, $f_c$, $T_{sys}$, and m

Calculation: Using the specified $P_{FA}$, $P_D$, and M, compute C/N from Metric 1, which is denoted as the threshold $(C/N)_{th}$. Then, the received C/N is computed, which is denoted as $(C/N)_{rx}$. The C for the receiver, $C_{rx}$, is computed from:

$$C_{rx}=\text{EIRP}-L_{path}+G_r \qquad (6)$$

where $G_r$ is assumed to be zero and $L_{path}$ is computed from Eqs. (4) and (5) using the specified $f_c$ and $R_d$. The receiver N is defined as:

$$N_{rx} = kT_{sys}B_N \quad (7)$$

where k is the Boltzmann's constant, $T_{sys}=300K$ (default—approximately room temperature by can be modified by the user), and $B_N=R_s$, which is unknown. Thus, $(C/N)_{rx}$ is obtained by Eqs. (6) and (7) and is set to:

$$(C/N)_{rx} = (C/N)_{th} \quad (8)$$

Eq. (8) is solved for $R_s$. Then, $R_b$ is computed from:

$$R_b = R_s m \quad (9)$$

The WAVE tool performs an intermediate check in some embodiments. If $C_{rx}<-150$ dBW or whatever the default or user-specified value is for the detectable power for the receiver, then the WAVE tool may inform the user that the receiver cannot detect the waveform at the given range.

Output: $R_b$

Metric 5: ToA vs. Message Size

Input: ToA, $R_S$ (e.g., a pull-down list of valid rates based on an existing waveform or user can enter the value for a new waveform), and m Calculation: message size=$R_s \cdot$ToA$\cdot$m It should be noted that the user may also be allowed to invert the calculation in some embodiments, the inputting desired message size and outputting the ToA.

Output: Message size (bits)

Metric 6: $R_b$ vs. ToA

Input: $R_b$ (e.g., a pull-down list of valid rates) and message size

Calculation: ToA=message size/$R_b$

Output: ToA

Metric 7: $R_s$ (or $R_b$) vs. $R_d$

Input: Input: $P_{FA}$, $P_D$, EIRP, $f_c$, and $R_s$ (e.g., a pull-down list of choices based on a pre-canned waveform or user can enter the value for a new waveform)

Calculation: Compute C/N from Metric 1 using ED. Set this as the default for $(C/N)_{th}$. Next, use Eqs. (6) and (7) with $G_r=0$ dB and $T_{sys}=300$ K (default, can be changed), with $B_N=R_s$, path loss given by Eq. (4), and $\lambda$ given in Eq. (5). Solve for $R_d$ by setting $(C/N)_{rx}=(C/N)_{th}$.

Output: $R_d$

Metric 8: $A_{er}$ vs. $R_d$

Input: EIRP, $P_r$, and $A_{er}$

Calculations: Using Eq. (3), again assume the default detectable power (unless changed by the user) as being $P_r=-150$ dBW. The receive antenna gain, $G_r$, is included by writing:

$$G_r = \frac{4\pi\eta A_r}{\lambda^2} \quad (10)$$

where the effective antenna area of the receiver antenna, $A_{er}$, is related to its physical area, $A_r$, by the efficiency $\eta$ as:

$$\eta A_r = A_{er} \quad (11)$$

Path loss is given in Eq. (4) and $\lambda$ given in Eq. (5). Using these parameters, Eq. (3) is solved for the detection range $R_d$.

Output: $R_d$

It should be noted that the carrier frequency cancels in the equations so it is not needed as an input, even though it would be needed to compute the path loss and gain of the receive antenna separately.

Metric 9: PSD vs. ITU Limits

Input: EIRP, $G_r$, $R_s$, $f_c$, and R (i.e., the distance to an intended receiver, such as a satellite)

Calculation: This metric checks whether the received PSD for the waveform meets or exceeds allowable limits for unintentional interference set by the ITU. Compute:

$$\frac{C}{B_N} = EIRP - L_{path} + G_r - B_N \quad (12)$$

where $L_{path}$ is again the loss as given in Eq. (4) and $B_N$=noise bandwidth=$R_s$. The WAVE tool of some embodiments alerts the user if $C/B_N>14$ dBW/Hz based on estimate of ITU limit. However, in some embodiments, this is a variable parameter that the user can change.

Output: PSD (i.e., $C/B_N$ W/Hz), and potentially a flag if this value exceeds the ITU limit.

Metric 10: PFD vs. ITU Limits

Input: EIRP and R

Calculation: The PFD is computed by:

$$PFD = \frac{EIRP}{4\pi R^2} \quad (13)$$

The WAVE tool in some embodiments may alert the user if PFD$>-110$ dBW/m$^2$ or some other default and potentially user-changeable threshold.

Output: PFD (W/m$^2$), and potentially a flag if this value exceeds the ITU limit.

Metric 11: B vs. Threat Detection Capabilities

Input: $R_b$, m, and $B_{th}$

Calculation: Compute the waveform bandwidth, B, which is approximately equal to $R_s$, where $$R_s = \frac{R_b}{m} \quad (14)$$

Output: B

It should be noted that in some embodiments, the WAVE tool will provide a flag or other indication when B is less than the bandwidth that a particular receiver can detect, $B_{th}$. The value of $B_{th}$ may be available from a pull-down menu of known receivers. One value may be given as a default, but can be changed by the user. Some commonly known receivers, such as those built by Rohde & Schwarz, may be included in the menu.

Metric 12: $E_s/N_0$ vs. $R_d$

Input: $P_{FA}$, $P_D$, EIRP, $f_c$, and $R_s$

Calculation: Set the threshold $(E_s/N_0)_{th}$ based on $P_{FA}$ and $P_D$ using Metric 1. Set $(E_s/N_0)_{th}=(C/N)_{rx}$, where $(C/N)_{rx}$ is given from Eqs. (6) and (7), where all parameters are inputs except $R_d$, and defaults may again be assumed unless changed by the user in some embodiments ($G_r=0$ dB and $T_{sys}=300$ K). Solve for $R_d$.

Output: $R_d$

Metric 13: PSD vs. $R_d$

Input: PSD, EIRP, $f_c$, and $R_s$

Calculation: $G_r=0$ dB and $B_N=R_s$, EIRP, $R_s$, and desired PSD(=$C/B_N$) are inputs. Solve Eq. (12) for $R_d$.

Output: $R_d$

Metric 14: $C/N_0$ vs. $R_d$ (or could instead be the distance to the intended receiver, such as a satellite)

Input: EIRP, set range for $R_d$ using a lower limit, $R_{d,\ min}$, and upper limit, $R_{d,\ max}$ (default values of 1 and 20 km, respectively, may be assumed in some embodiments, for example)

Calculation: Compute $$N_0 = kT_{sys} \quad (15)$$

where $T_{sys}=300$ K is the default that may be changed. For each $R_d$ from $R_{d,\ min}$ to $R_{d,\ max}$ in steps of 1 km, for example, calculate received power C from Eq. (3), where $L_{path}$ is given in Eq. (4) and $G_r=0$. Compute $C/N_0$.

Output: Plot of $R_d$ VS. $C/N_0$

Metric 15: FFT magnitude of a waveform, which allows features to be detected. FFT raster plots may also be generated.

Metric 16: FFT of autocorrelation of a waveform, which allows for detectability features to be seen. FFT raster plots may also be generated.

Metric 17: FFT of cross-correlation of two or more waveforms, which allows for similarity assessment between these waveforms. FFT raster plots may also be generated.

Metric 18: CAF of a waveform or CAF of multiple different waveforms to allow assessment of whether a waveform may be geolocated.

It should be noted that for Metrics 15-18, the WAVE tool of some embodiments provides a threshold such that if the value of the FFTs or CAF exceeds the threshold, which indicates features or geolocation capability, respectively, the user may be notified.

The WAVE tool of some embodiments may utilize machine learning (ML) algorithms, such as deep learning neural networks (DLNNs), shallow learning neural networks (SLNNs), etc. Neural network topologies employed in some embodiments may include, but are not limited to, perceptrons, feed forward, radial basis networks, deep feed forward, recurrent neural networks, long/short term memory, gated recurrent units, auto encoders, variational auto encoders, denoising auto encoders, sparse auto encoders, Markov chains, Hopfield networks, Boltzmann machines, restricted Boltzmann machines, deep belief networks, deep convolutional networks, deconvolutional networks, deep convolutional inverse graphics networks, generative adversarial networks, liquid state machines, extreme learning machines, echo state networks, deep residual networks, Kohonen networks, support vector machines, neural Turing machines, any other existing or newly developed types of neural networks, or any combination thereof. For example, ML may be used to automate the optimization of a waveform using a given operating environment and/or atmospheric channel characteristics. Waveforms can be improved to optimize multiple cost functions or criteria in some embodiments.

A ML reward function could be employed that automatically tweaks a waveform with the aim of achieving a goal. For instance, the reward function may encourage an ML model to try to tweak the waveform to reduce detection range, time on air, not exceeding ITU limits on transmitting power so as not to interfere with others (this may lead to detection), etc. A scoring system may be applied to the metrics, potentially with different weights. For instance, if a small detection range is the most important criterion, the reward function may be designed to train the ML model to prioritize detection range metrics over other metrics by a certain amount (e.g., detection range may be given a weight that is 1.5, 2, 3, 5, 10, etc. times higher than the weight that time on air is given, for example, in computing an overall metric). Any desired weights may be used without deviating from the scope of the invention.

During training, if the ML model is not able to achieve improvement, or achieve sufficient improvement (e.g., 1%, 5%, 25%, etc.) over the previous version of the ML model, a user may be asked to provide assistance by changing the reward function, changing the input data, manually modifying the waveform characteristics, etc. In this manner, training may be iterative and improving versions of the ML model may be generated. Also, deployed (production) versions of the ML model may be retrained if data or model drift occurs due, for instance, to a different signal environment, improved and/or an increased amount of signal detection equipment, etc.

Alternatively, some embodiments may be deterministic rather than probabilistic in nature. For instance, the WAVE tool of some embodiments may try a range of input values and choose the best combination of results based on the desired scores/weights. For Metric 3, EIRP, $f_c$, and $P_r$ could each be varied within a range, and the EIRP, $f_c$, and $P_r$ that achieve the best EIRP vs. $R_d$ may be selected.

Enhancements and modifications may be added as the environment changes (e.g., atmospheric changes and/or interference). The WAVE tool can be adapted in some embodiments for better performance based on the local threat environment. Also, while the 18 metrics noted above provide information to a user regarding whether a waveform is LPD/I, new metrics may be added to the set and/or one or more of the metrics may be removed or replaced as it is deemed no longer useful or a different metric is deemed more suitable. Furthermore, the WAVE tool in some embodiments can adapt as the threat environment advances and continues to change. Thus, the WAVE tool can evolve with the space enterprise.

Various scoring systems may be used by the WAVE tool without deviating from the scope of the invention. For example, for the metrics that are used, a score for each metric and a sum of a scores of all used metrics may be provided. For example, for detection range, a score of 10 may be assigned to 1 km or less, a 1 may be assigned to 100 km or more, and values in between may be assigned scores based on how close the detection range is to the desired max detectable range of 1 km. The metrics may be weighted in some embodiments if certain metrics are deemed more important for the application of the waveform.

In certain embodiments, a given metric score or sum score may be binary. For instance, if it is desired that the waveform not be detectable at a range of greater than 1 km, the value may be 0 if the waveform is detectable at more than this range and 1 if the waveform is detectable at 1 km or less. If two or more waveforms are being compared, in some embodiments, a binary 1 may be assigned to the waveform that has the best performance per the metrics (and weights, if they are used) and a 0 may be assigned to the others. Alternatively, the WAVE tool may simply inform the user which waveform is the best. The user could then set about attempting to improve the characteristics of the waveform, if desired, or the WAVE tool could attempt to do so automatically.

Figure 3:
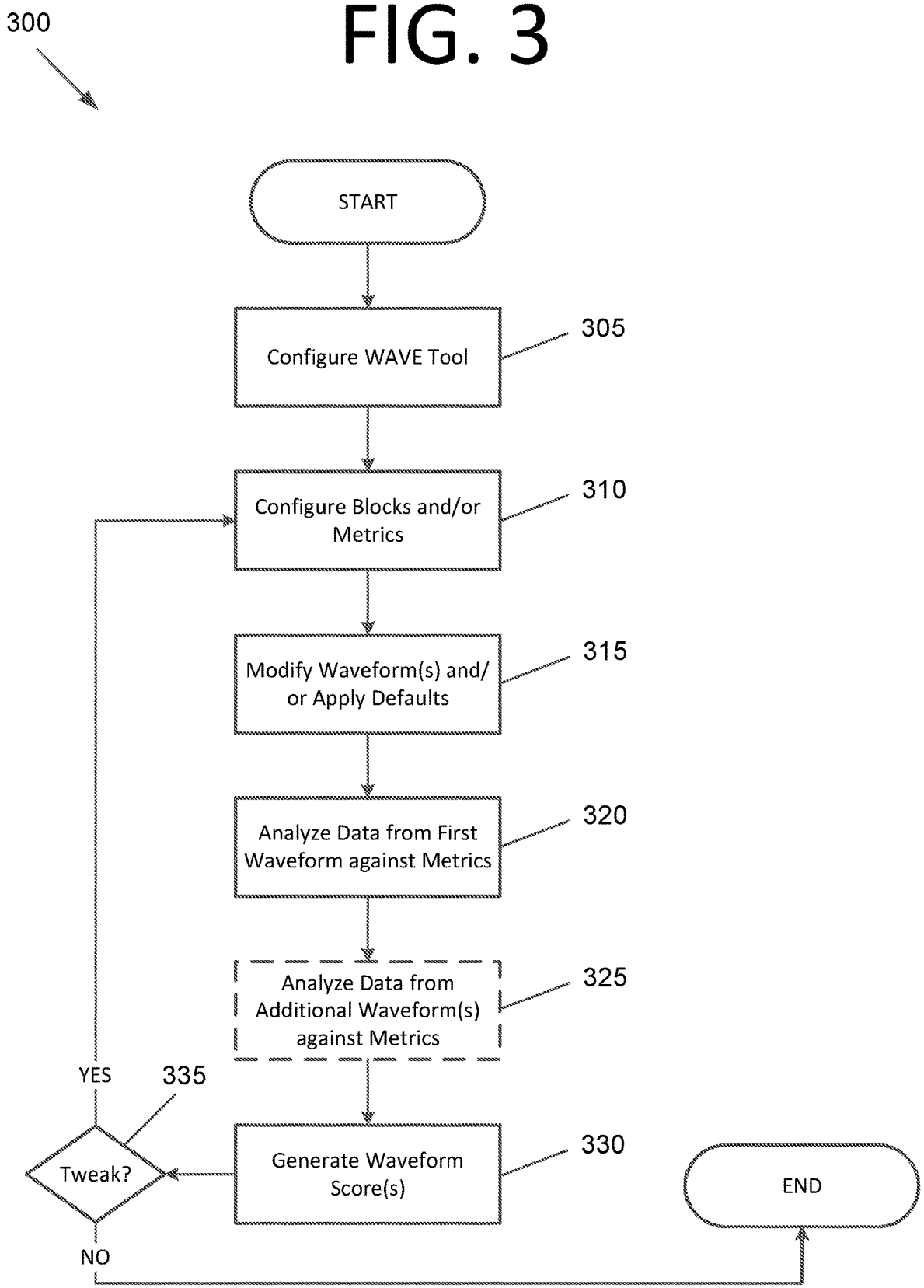
FIG. 3 is a flowchart illustrating a process for analyzing and modifying one or more waveforms, according to an embodiment of the present invention.

FIG. 3 is a flowchart illustrating a process 300 for analyzing and modifying one or more waveforms, according to an embodiment of the present invention. The process begins with configuring a WAVE tool at 305. The configuration may include, but is not limited to, providing a library of pre-canned waveforms, training an ML model that the WAVE tool can use to automatically modify waveform characteristics and attempt to improve waveform performance, programming the WAVE tool to be able to apply a plurality of metrics for analyzing waveforms, providing default input values for some or all metrics, any combination thereof, etc.

In some embodiments, blocks and/or metrics for one or more waveforms may be configured at 310. In some embodiments, the blocks and/or metrics may be displayed to the user in a similar manner to GUI 200 of FIG. 2. The blocks may pertain to various configurable waveform options/parameters including, but not limited to, appending a preamble, applying FEC, applying an interleaver, applying spreading, applying scrambling sequences, appending a postamble, applying one or more digital modulation schemes, turning a channel off, applying a channel model, or any combination thereof. In certain embodiments, default settings may be used. Metrics may also be selected, deselected, and or configured. Configurable metrics may include, but are not limited to, the various metrics discussed above. In some embodiments, the user may modify waveform parameters and these modifications may be incorporated into the waveform and/or default values may be applied at 315. Default values may be applied, for example, when they are not provided or overridden by a user.

The WAVE tool then analyzes data from a first waveform against a plurality of metrics at 320. The analysis of the data from the first waveform includes providing inputs for the plurality of metrics from user-selected parameters, default parameters provided by the WAVE tool, or a combination thereof. Data from one or more other waveforms (e.g., a second waveform, a third waveform, an $N^{th}$ waveform, etc.) may also be analyzed at 325, if desired. The waveforms may be pre-canned, based on real world data form a real waveform that has been generated and transmitted, or custom designed using the WAVE tool in some embodiments.

In some embodiments, at least one of the plurality of metrics pertains to detection range of the waveform, estimated time on air, or transmitting power. However, any suitable metrics may be used without deviating from the scope of the invention. For instance, in some embodiments, one, some, or all of the metrics described above may be used.

One or more scores pertaining to performance of the waveform(s) against the one or more metrics, performance of a waveform versus one or more other waveforms, or both, are generated at 330. In certain embodiments, the comparison between the first waveform and the additional waveform(s) compares similarity between these waveforms. If further tweaks/modifications to waveform(s) are desired, the user may return to configuring blocks and/or metrics at 310, may modify waveform(s) at 315, or both. The process may be repeated as often as desired until the desired waveform performance is achieved. In some embodiments, the tweaking/modification may be performed automatically. The process of providing configurable waveform parameters, receiving selections from the configurable waveform parameters for the waveform(s), and modifying the waveform(s) using the received selections may thus be repeated until one or more waveform criteria are satisfied.

In some embodiments, automatic tweaking of the waveform(s) in steps 310 and 315 and subsequent analysis in steps 320 and 325 and score generation in step 330 may be performed by a trained ML model that has been trained to automate optimization of waveforms using a given operating environment, atmospheric channel characteristics, or both, based on a reward function for optimizing one or more metrics. The ML model may be executed on the waveform data as part of steps 310 to 330. In some embodiments, the ML model or deterministic logic may discard modifications to the waveform(s) if performance does not improve.

Figure 4:
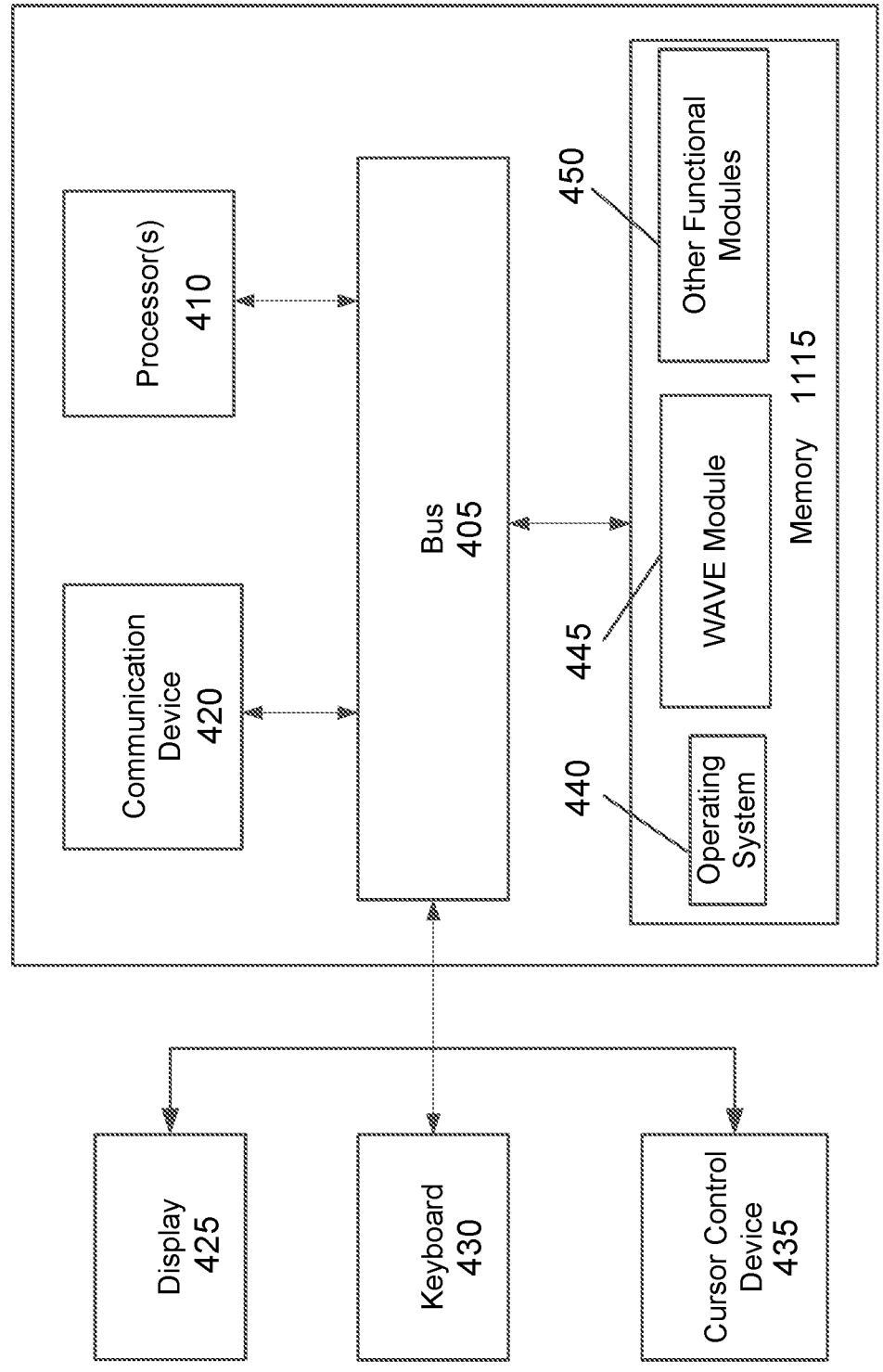
FIG. 4 is an architectural diagram illustrating a computing system configured to implement a WAVE tool, according to an embodiment of the present invention.

FIG. 4 is an architectural diagram illustrating a computing system 400 configured to implement a WAVE tool, according to an embodiment of the present invention. Computing system 400 includes a bus 405 or other communication mechanism for communicating information, and processor(s) 410 coupled to bus 405 for processing information. Processor(s) 410 may be any type of general or specific purpose processor, including a Central Processing Unit (CPU), an Application Specific Integrated Circuit (ASIC), a Field Programmable Gate Array (FPGA), a Graphics Processing Unit (GPU), multiple instances thereof, and/or any combination thereof. Processor(s) 410 may also have multiple processing cores, and at least some of the cores may be configured to perform specific functions. Multi-parallel processing may be used in some embodiments. In certain embodiments, at least one of processor(s) 410 may be a neuromorphic circuit that includes processing elements that mimic biological neurons. In some embodiments, neuromorphic circuits may not require the typical components of a Von Neumann computing architecture.

Computing system 400 further includes memory 415 for storing information and instructions to be executed by processor(s) 410. Memory 415 can be comprised of any combination of Random Access Memory (RAM), Read Only Memory (ROM), flash memory, cache, static storage such as a magnetic or optical disk, or any other types of non-transitory computer-readable media or combinations thereof. Non-transitory computer-readable media may be any available media that can be accessed by processor(s) 410 and may include volatile media, non-volatile media, or both. The media may also be removable, non-removable, or both.

Additionally, computing system 400 includes a communication device 420, such as a transceiver, to provide access to a communications network via a wireless and/or wired connection. In some embodiments, communication device 420 may be configured to use Frequency Division Multiple Access (FDMA), Single Carrier FDMA (SC-FDMA), Time Division Multiple Access (TDMA), Code Division Multiple Access (CDMA), Orthogonal Frequency Division Multiplexing (OFDM), Orthogonal Frequency Division Multiple Access (OFDMA), Global System for Mobile (GSM) communications, General Packet Radio Service (GPRS), Universal Mobile Telecommunications System (UMTS), cdma2000, Wideband CDMA (W-CDMA), High-Speed Downlink Packet Access (HSDPA), High-Speed Uplink Packet Access (HSUPA), High-Speed Packet Access (HSPA), Long Term Evolution (LTE), LTE Advanced (LTE-A), 802.11x, Wi-Fi, Zigbee, Ultra-WideBand (UWB), 802.16x, 802.15, Home Node-B (HnB), Bluetooth, Radio Frequency Identification (RFID), Infrared Data Association (IrDA), Near-Field Communications (NFC), fifth generation (5G), New Radio (NR), any combination thereof, and/or any other currently existing or future-implemented communications standard and/or protocol without deviating from the scope of the invention. In some embodiments, communication device 420 may include one or more antennas that are singular, arrayed, phased, switched, beamforming, beamsteering, a combination thereof, and or any other antenna configuration without deviating from the scope of the invention.

Processor(s) 410 are further coupled via bus 405 to a display 425, such as a plasma display, a Liquid Crystal Display (LCD), a Light Emitting Diode (LED) display, a Field Emission Display (FED), an Organic Light Emitting Diode (OLED) display, a flexible OLED display, a flexible substrate display, a projection display, a 4K display, a high definition display, a Retina® display, an In-Plane Switching (IPS) display, or any other suitable display for displaying information to a user. Display 425 may be configured as a touch (haptic) display, a three dimensional (3D) touch display, a multi-input touch display, a multi-touch display, etc. using resistive, capacitive, surface-acoustic wave (SAW) capacitive, infrared, optical imaging, dispersive signal technology, acoustic pulse recognition, frustrated total internal reflection, etc. Any suitable display device and haptic I/O may be used without deviating from the scope of the invention.

A keyboard 430 and a cursor control device 435, such as a computer mouse, a touchpad, etc., are further coupled to bus 405 to enable a user to interface with computing system 400. However, in certain embodiments, a physical keyboard and mouse may not be present, and the user may interact with the device solely through display 425 and/or a touchpad (not shown). Any type and combination of input devices may be used as a matter of design choice. In certain embodiments, no physical input device and/or display is present. For instance, the user may interact with computing system 400 remotely via another computing system in communication therewith, or computing system 400 may operate autonomously.

Memory 415 stores software modules that provide functionality when executed by processor(s) 410. The modules include an operating system 440 for computing system 400. The modules further include a WAVE module 445 that is configured to perform all or part of the processes described herein or derivatives thereof. Computing system 400 may include one or more additional functional modules 450 that include additional functionality.

One skilled in the art will appreciate that a "system" could be embodied as a server, an embedded computing system, a personal computer, a console, a personal digital assistant (PDA), a cell phone, a tablet computing device, a quantum computing system, or any other suitable computing device, or combination of devices without deviating from the scope of the invention. Presenting the above-described functions as being performed by a "system" is not intended to limit the scope of the present invention in any way, but is intended to provide one example of the many embodiments of the present invention. Indeed, methods, systems, and apparatuses disclosed herein may be implemented in localized and distributed forms consistent with computing technology, including cloud computing systems.

It should be noted that some of the system features described in this specification have been presented as modules, in order to more particularly emphasize their implementation independence. For example, a module may be implemented as a hardware circuit comprising custom very large scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, include one or more physical or logical blocks of computer instructions that may, for instance, be organized as an object, procedure, or function. Nevertheless, the executables of an identified module need not be physically located together, but may include disparate instructions stored in different locations that, when joined logically together, comprise the module and achieve the stated purpose for the module. Further, modules may be stored on a computer-readable medium, which may be, for instance, a hard disk drive, flash device, RAM, tape, and/or any other such non-transitory computer-readable medium used to store data without deviating from the scope of the invention.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

The process steps performed in FIGS. 1 and 3 may be performed by a computer program, encoding instructions for the processor(s) to perform at least part of the process(es) described in FIGS. 1 and 3, in accordance with embodiments of the present invention. The computer program may be embodied on a non-transitory computer-readable medium. The computer-readable medium may be, but is not limited to, a hard disk drive, a flash device, RAM, a tape, and/or any other such medium or combination of media used to store data. The computer program may include encoded instructions for controlling processor(s) of a computing system (e.g., processor(s) 410 of computing system 400 of FIG. 4) to implement all or part of the process steps described in FIGS. 1 and 3, which may also be stored on the computer-readable medium.

The computer program can be implemented in hardware, software, or a hybrid implementation. The computer program can be composed of modules that are in operative communication with one another, and which are designed to pass information or instructions to display. The computer program can be configured to operate on a general purpose computer, an ASIC, or any other suitable device.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
   memory storing computer program instructions for performing waveform vulnerability analysis for assessing a likelihood that the waveform will be intercepted by an unintended recipient; and
   at least one processor configured to execute the computer program instructions, wherein the computer program instructions are configured to cause the at least one processor to:
      prior to transmission of a first waveform, analyze data from the first waveform against a plurality of metrics, the analysis of the data from the first waveform comprising providing inputs for the plurality of metrics from user-selected parameters, default parameters, or a combination thereof, and calculating the plurality of metrics,
      generate one or more scores pertaining to performance of the first waveform against the plurality of calculated metrics, and
      display the generated scores pertaining to the performance of the first waveform, the generated scores pertaining at least in part to a likelihood of the first waveform being intercepted, wherein
   the calculating of the plurality of metrics comprises at least one of calculating:
      (1) a signal-to-noise ratio (SNR) with a desired probability of false alarm ($P_{FA}$), a desired probability of detection ($P_D$), and a number of samples to average (M) as inputs and an SNR associated with $P_D$ as an output, or alternatively, a curve of the SNR versus $P_D$ as an output with $P_{FA}$ and M as inputs,
      (2) the SNR versus $P_D$ for a cyclo-stationary feature detector (CFD) with the desired $P_{FA}$, the desired $P_D$, and M as inputs and the SNR associated with $P_D$ as an output,
      (3) effective isotropic radiated power (EIRP) versus a free space detection range $R_d$ with the EIRP, a carrier frequency ($f_c$), and a received power ($P_r$) as inputs and $R_d$ as an output,
      (4) the EIRP versus a bit rate ($R_b$) with $P_{FA}$, $P_D$, the EIRP, $R_d$, $f_c$, a receiver system noise temperature ($T_{sys}$), and a number of bits per symbol m as inputs and $R_b$ as an output,
      (5) time-on-air (ToA) versus message size with ToA, a symbol rate ($R_s$), and m as inputs and the message size as an output,
      (6) $R_b$ versus ToA with $R_b$ and message size as inputs and ToA as an output,
      (7) $R_S$ or $R_b$ versus $R_d$ with $P_{FA}$, $P_D$, EIRP, $f_c$, and $R_s$ as inputs and $R_d$ as an output,
      (8) effective area of a receiver antenna ($A_{er}$) versus $R_d$ with EIRP, $P_r$, and $A_{er}$ as inputs and $R_d$ as an output,
      (9) power spectral density (PSD) vs. International Telecommunication Union (ITU) limits with EIRP, a receive antenna gain ($G_r$), $R_s$, $f_c$, and a range to an intended receiver (R) as inputs and PSD and/or a flag responsive to the PSD exceeding ITU limits as outputs,
      (10) power flux density (PFD) versus ITU limits with the EIRP and R as inputs and the PFD and/or a flag responsive to the PFD exceeding ITU limits as outputs,
      (11) a bandwidth versus threat detection capabilities with $R_b$, m, and a threat receiver bandwidth ($B_{th}$) as inputs and B as an output,
      (12) energy per symbol($E_S$)/noise PSD ($N_0$) versus $R_d$ with $P_{FA}$, $P_D$, the EIRP, $f_c$, and $R_S$ as inputs and $R_d$ as an output,
      (13) the PSD versus $R_d$ with the PSD, EIRP, $f_c$, and $R_s$ as inputs and $R_d$ as an output,
      (14) a carrier to noise PSD ratio ($C/N_0$) versus $R_d$ with the EIRP, a set range for $R_d$ using a lower limit ($R_{d,min}$) and an upper limit ($R_{d,max}$) as inputs and a plot of $R_d$ vs. $C/N_0$ as an output,
      (15) a fast Fourier transform (FFT) magnitude of the waveform
      (16) an FFT of an autocorrelation of the waveform,
      (17) an FFT of a cross-correlation of two or more waveforms, and
      (18) a cross-ambiguity function (CAF) of the waveform.

2. The apparatus of claim 1, wherein at least one of the plurality of metrics pertains to detection range of the waveform, estimated time on air, or transmitting power.

3. The apparatus of claim 1, wherein the computer program instructions are further configured to cause the at least one processor to:
   prior to transmission of a second waveform, analyze data from the second waveform against the plurality of metrics, the analysis of the data from the second waveform comprising providing inputs for the plurality of metrics from user-selected parameters, default parameters, or a combination thereof, and calculating the plurality of metrics;
   generate one or more scores pertaining to performance of the second waveform against the plurality of calculated metrics;
   provide a comparison between the first waveform and the second waveform using the one or more scores generated for the first waveform and the one or more scores generated for the second waveform, provide an indication of which waveform between the first waveform and the second waveform performed better using the one or more scores generated for the first waveform and the one or more scores generated for the second waveform, or both; and display the provided comparison between the first waveform and the second waveform.

4. The apparatus of claim 3, wherein the comparison between the first waveform and the second waveform compares similarity between the first waveform and the second waveform.

5. The apparatus of claim 1, wherein the first waveform is a pre-canned waveform representing a known waveform from a library.

6. The apparatus of claim 1, wherein the first waveform is a custom waveform that has been developed using a waveform analysis and vulnerability assessment (WAVE) tool.

7. The apparatus of claim 1, wherein the computer program instructions are further configured to cause the at least one processor to:

provide configurable waveform parameters;

receive selections from the configurable waveform parameters for the first waveform; and modify the first waveform using the received selections.

8. The apparatus of claim 7, wherein the configurable waveform parameters comprise scrambling parameters, spreading parameters, modulation parameters, or any combination thereof.

9. The apparatus of claim 7, wherein the computer program instructions are further configured to cause the at least one processor to:

repeat the process of providing the configurable waveform parameters, receiving selections from the configurable waveform parameters for the first waveform, and modifying the first waveform using the received selections until one or more waveform criteria are satisfied.

10. The apparatus of claim 7, wherein the computer program instructions are further configured to cause the at least one processor to:

provide an indication to a user when one or more of the configurable waveform parameter selections is invalid or outside of an acceptable range for that parameter.

11. The apparatus of claim 1, wherein the computer program instructions are further configured to cause the at least one processor to:

display selectable metrics;

receive selections of two or more metrics; and use the selected two or more metrics as part or all of the plurality of metrics used to analyze the data from the first waveform.

12. The apparatus of claim 1, wherein the data for the first waveform is or comprises data from a real waveform that has been generated and transmitted.

13. The apparatus of claim 1, wherein the computer program instructions are further configured to cause the at least one processor to:

generate general waveform parameters for the first waveform, the general waveform parameters comprising sampling frequency ($f_s$), carrier frequency ($f_c$), bit rate ($R_b$), a number of bits to generate ($N_b$), or any combination thereof.

14. The apparatus of claim 1, wherein the computer program instructions are further configured to cause the at least one processor to:

append a preamble, apply forward error correction (FEC), apply an interleaver, apply spreading, apply scrambling sequences, append a postamble, apply one or more digital modulation schemes, turn a channel off, apply a channel model, or any combination thereof, using default settings.

15. The apparatus of claim 1, wherein the inputs for the plurality of metrics comprise a sampling frequency ($f_s$), a probability of false alarm ($P_{FA}$), a minimum signal-to-noise ratio (SNR), a maximum SNR, a number of samples to average (M), a bit rate ($R_b$), a time of arrival (ToA), or any combination thereof.

16. The apparatus of claim 1, wherein the computer program instructions are further configured to cause the at least one processor to:

provide default input values for the plurality of metrics when values for the inputs for the plurality of metrics are not specified by a user.

17. The apparatus of claim 1, wherein the plurality of metrics comprise an energy detector, a cyclo-stationary feature detector (CFD), or both.

18. The apparatus of claim 1, wherein the plurality of metrics comprise a Fast Fourier Transform (FFT) of a magnitude of the first waveform, an FFT of autocorrelation of the waveform, an FFT of cross-correlation of the first waveform and a second waveform, a cross-ambiguity function (CAF) of the first waveform, a CAF of the first waveform and at least one other waveform, or any combination thereof.

19. The apparatus of claim 1, wherein the computer program instructions are further configured to cause the at least one processor to:

train a machine learning (ML) model to automate optimization of waveforms using a given operating environment, atmospheric channel characteristics, or both, based on a reward function for optimizing one or more metrics; and execute the trained ML model using the data from the first waveform to automatically modify the first waveform and improve performance of the first waveform for at least one of the plurality of metrics.

20. The apparatus of claim 1, wherein the generating of the one or more scores pertaining to performance of the first waveform against the one or more metrics comprises applying a respective weight to at least one of the one or more metrics.

21. The apparatus of claim 1, wherein the computer program instructions are further configured to cause the at least one processor to:

automatically modify parameters for at least one of the plurality of metrics; and modify the first waveform to incorporate the automatically modified parameters when performance of at least one of the plurality of metrics improves.

22. A non-transitory computer-readable medium storing a computer program for performing waveform vulnerability analysis for assessing a likelihood that the waveform will be intercepted by an unintended recipient, the computer program configured to cause at least one processor to:

prior to transmission of a first waveform, analyze data from the first waveform against a plurality of metrics, the analysis of the data from the first waveform comprising providing inputs for the plurality of metrics from user-selected parameters, default parameters, or a combination thereof, and calculating the plurality of metrics;

prior to transmission of a second waveform, analyze data from the second waveform against the plurality of metrics, the analysis of the data from the second waveform comprising providing inputs for the plurality of metrics from user-selected parameters, default parameters, or a combination thereof;

generate one or more scores pertaining to performance of the first waveform against the plurality of calculated metrics, the scores pertaining to detectability of the first waveform;

generate one or more scores pertaining to performance of the second waveform against the plurality of calculated metrics, the scores pertaining to detectability of the second waveform;

provide a comparison between the first waveform and the second waveform using the one or more scores generated for the first waveform and the one or more scores generated for the second waveform, provide an indication of which waveform between the first waveform and the second waveform performed better using the one or more scores generated for the first waveform and the one or more scores generated for the second waveform, or both; and display the provided comparison between the first waveform and the second waveform and the generated scores pertaining to at least one of the first waveform and the second waveform, the generated scores pertaining at least in part to a likelihood of the first waveform and/or the second waveform being intercepted, wherein the calculating of the plurality of metrics comprises at least one of calculating:

(1) a signal-to-noise ratio (SNR) with a desired probability of false alarm ($P_{FA}$), a desired probability of detection ($P_D$), and a number of samples to average (M) as inputs and an SNR associated with $P_D$ as an output, or alternatively, a curve of the SNR versus $P_D$ as an output with $P_{FA}$ and M as inputs, (2) the SNR versus $P_D$ for a cyclo-stationary feature detector (CFD) with the desired $P_{FA}$, the desired $P_D$, and M as inputs and the SNR associated with $P_D$ as an output, (3) effective isotropic radiated power (EIRP) versus a free space detection range $R_d$ with the EIRP, a carrier frequency ($f_c$), and a received power ($P_r$) as inputs and $R_d$ as an output, (4) the EIRP versus a bit rate ($R_b$) with $P_{FA}$, $P_D$, the EIRP, $R_d$, $f_c$, a receiver system noise temperature ($T_{sys}$), and a number of bits per symbol m as inputs and $R_b$ as an output, (5) time-on-air (ToA) versus message size with ToA, a symbol rate ($R_s$), and m as inputs and the message size as an output, (6) $R_b$ versus ToA with $R_b$ and message size as inputs and ToA as an output, (7) $R_s$ or $R_b$ versus $R_d$ with $P_{FA}$, $P_D$, EIRP, $f_c$, and $R_s$ as inputs and Ra as an output, (8) effective area of a receiver antenna ($A_{er}$) versus $R_d$ with EIRP, $P_r$, and $A_{er}$ as inputs and $R_d$ as an output, (9) power spectral density (PSD) vs. International Telecommunication Union (ITU) limits with EIRP, a receive antenna gain ($G_r$), $R_s$, $f_c$, and a range to an intended receiver (R) as inputs and PSD and/or a flag responsive to the PSD exceeding ITU limits as outputs,

(10) power flux density (PFD) versus ITU limits with the EIRP and R as inputs and the PFD and/or a flag responsive to the PFD exceeding ITU limits as outputs,

(11) a bandwidth versus threat detection capabilities with $R_b$, m, and a threat receiver bandwidth ($B_{th}$) as inputs and B as an output,

(12) energy per symbol($E_s$)/noise PSD ($N_0$) versus $R_d$ with $P_{FA}$, $P_D$, the EIRP, $f_c$, and $R_s$ as inputs and $R_d$ as an output,

(13) the PSD versus $R_d$ with the PSD, EIRP, $f_c$, and $R_s$ as inputs and $R_d$ as an output,

(14) a carrier to noise PSD ratio ($C/N_0$) versus $R_d$ with the EIRP, a set range for $R_d$ using a lower limit ($R_{d,min}$) and an upper limit ($R_{d,max}$) as inputs and a plot of $R_d$ vs. $C/N_0$ as an output,

(15) a fast Fourier transform (FFT) magnitude of the waveform

(16) an FFT of an autocorrelation of the waveform,

(17) an FFT of a cross-correlation of two or more waveforms, and

(18) a cross-ambiguity function (CAF) of the waveform.

23. The non-transitory computer-readable medium of claim 22, wherein the comparison between the first waveform and the second waveform compares similarity between the first waveform and the second waveform.

24. The non-transitory computer-readable medium of claim 22, wherein the computer program is further configured to cause the at least one processor to:

provide configurable waveform parameters;

receive selections from the configurable waveform parameters for the first waveform, the second waveform, or both; and modify the first waveform, the second waveform, or both, using the received selections.

25. The non-transitory computer-readable medium of claim 24, wherein the configurable waveform parameters comprise scrambling parameters, spreading parameters, modulation parameters, or any combination thereof.

26. The non-transitory computer-readable medium of claim 24, wherein the computer program is further configured to cause the at least one processor to:

repeat the process of providing the configurable waveform parameters, receiving selections from the configurable waveform parameters for the first waveform, the second waveform, or both, and modifying the first waveform, the second waveform, or both, using the received selections until one or more waveform criteria are satisfied.

27. The non-transitory computer-readable medium of claim 22, wherein the computer program is further configured to cause the at least one processor to:

display selectable metrics;

receive selections of two or more metrics; and use the selected two or more metrics as part or all of the plurality of metrics used to analyze the data from the first waveform, the second waveform, or both.

28. The non-transitory computer-readable medium of claim 22, wherein the computer program is further configured to cause the at least one processor to:

generate general waveform parameters for the first waveform, the second waveform, or both, wherein the general waveform parameters comprise sampling frequency ($f_s$), carrier frequency ($f_c$), bit rate ($R_b$), a number of bits to generate ($N_b$), or any combination thereof.

29. The non-transitory computer-readable medium of claim 22, wherein the computer program is further configured to cause the at least one processor to:

append a preamble, apply forward error correction (FEC), apply an interleaver, apply spreading, apply scrambling sequences, append a postamble, apply one or more digital modulation schemes, turn a channel off, apply a channel model, or any combination thereof, using default settings.

30. The non-transitory computer-readable medium of claim 22, wherein the inputs for the plurality of metrics comprise a sampling frequency ($f_s$), a probability of false alarm ($P_{FA}$), a minimum signal-to-noise ratio (SNR), a maximum SNR, a number of samples to average (M), a bit rate ($R_b$), a time of arrival (ToA), or any combination thereof.

31. The non-transitory computer-readable medium of claim 22, wherein the computer program is further configured to cause the at least one processor to:
provide default input values for the plurality of metrics when values for the inputs for the plurality of metrics are not specified by a user.

* * * * *